United States Patent
Suzuki et al.

(10) Patent No.: US 9,797,067 B2
(45) Date of Patent: Oct. 24, 2017

(54) SELECTIVE EPITAXIAL GROWTH METHOD AND FILM FORMING APPARATUS

(71) Applicant: TOKYO ELECTRON LIMITED, Tokyo (JP)

(72) Inventors: Daisuke Suzuki, Nirasaki (JP); Akinobu Kakimoto, Nirasaki (JP); Satoshi Onodera, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 517 days.

(21) Appl. No.: 14/197,359

(22) Filed: Mar. 5, 2014

(65) Prior Publication Data

US 2014/0251203 A1  Sep. 11, 2014

(30) Foreign Application Priority Data

Mar. 6, 2013  (JP) .................................. 2013-043995

(51) Int. Cl.
  *C30B 25/16* (2006.01)
  *C30B 29/06* (2006.01)
  *H01L 21/02* (2006.01)

(52) U.S. Cl.
  CPC .............. *C30B 25/16* (2013.01); *C30B 29/06* (2013.01); *H01L 21/0262* (2013.01);
  (Continued)

(58) Field of Classification Search
  CPC ......... H01L 21/02381; H01L 21/02532; H01L 21/02636; C30B 25/16; C30B 29/06
  See application file for complete search history.

(56) References Cited

U.S. PATENT DOCUMENTS

| 2006/0115933 A1* | 6/2006 | Ye ..................... H01L 21/02381 438/139 |
| 2009/0189199 A1* | 7/2009 | Moriyama ............ H01L 29/045 257/255 |
| 2011/0117732 A1* | 5/2011 | Bauer ............... H01L 21/02381 438/507 |

FOREIGN PATENT DOCUMENTS

| JP | 2006-59858 A | 3/2006 |
| JP | 2007-42671 A | 2/2007 |

(Continued)

OTHER PUBLICATIONS

European Patent Office, English computer translation of JP2008060383 (2017).*

*Primary Examiner* — Matthew Song
(74) *Attorney, Agent, or Firm* — Nath, Goldberg & Meyer; Jerald L. Meyer; Annie J. Kock

(57) ABSTRACT

A selective epitaxial growth method includes preparing a target object including a single crystal substrate in which an epitaxial growth region is partitioned by a suppression film; and growing the epitaxial layer on the epitaxial growth region of the target object until a predetermined film thickness is obtained. The growing the epitaxial layer includes first source gas supply process of supplying a source gas onto the target object under a first pressure to grow a first epitaxial layer on the epitaxial growth region, first removing process of removing deposits on the suppression film, second source gas supply process of supplying the source gas onto the target object under a second pressure higher than the first pressure, and second removing process of removing the deposits on the suppression film. The second source gas supply process and the second removing process are repeated until the predetermined film thickness is obtained.

11 Claims, 16 Drawing Sheets

(52) U.S. Cl.
CPC .. *H01L 21/02381* (2013.01); *H01L 21/02532* (2013.01); *H01L 21/02639* (2013.01)

(56) References Cited

FOREIGN PATENT DOCUMENTS

| | | | | |
|---|---|---|---|---|
| JP | 2007-305730 A | | 11/2007 | |
| JP | 2008060383 A | * | 3/2008 | ............. H01L 21/76 |
| JP | 2008-85198 A | | 4/2008 | |
| JP | 2010-10513 A | | 1/2010 | |

* cited by examiner

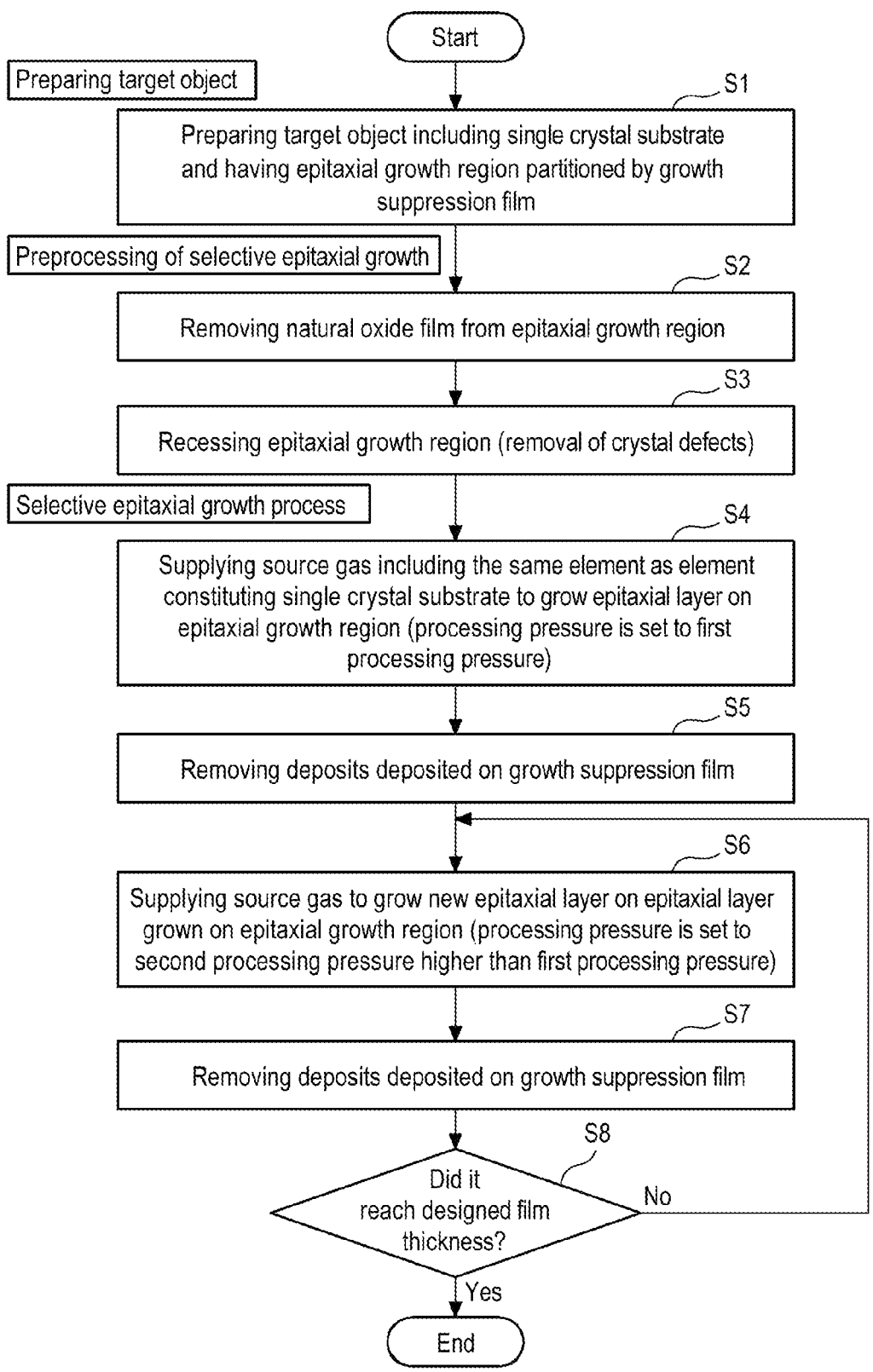

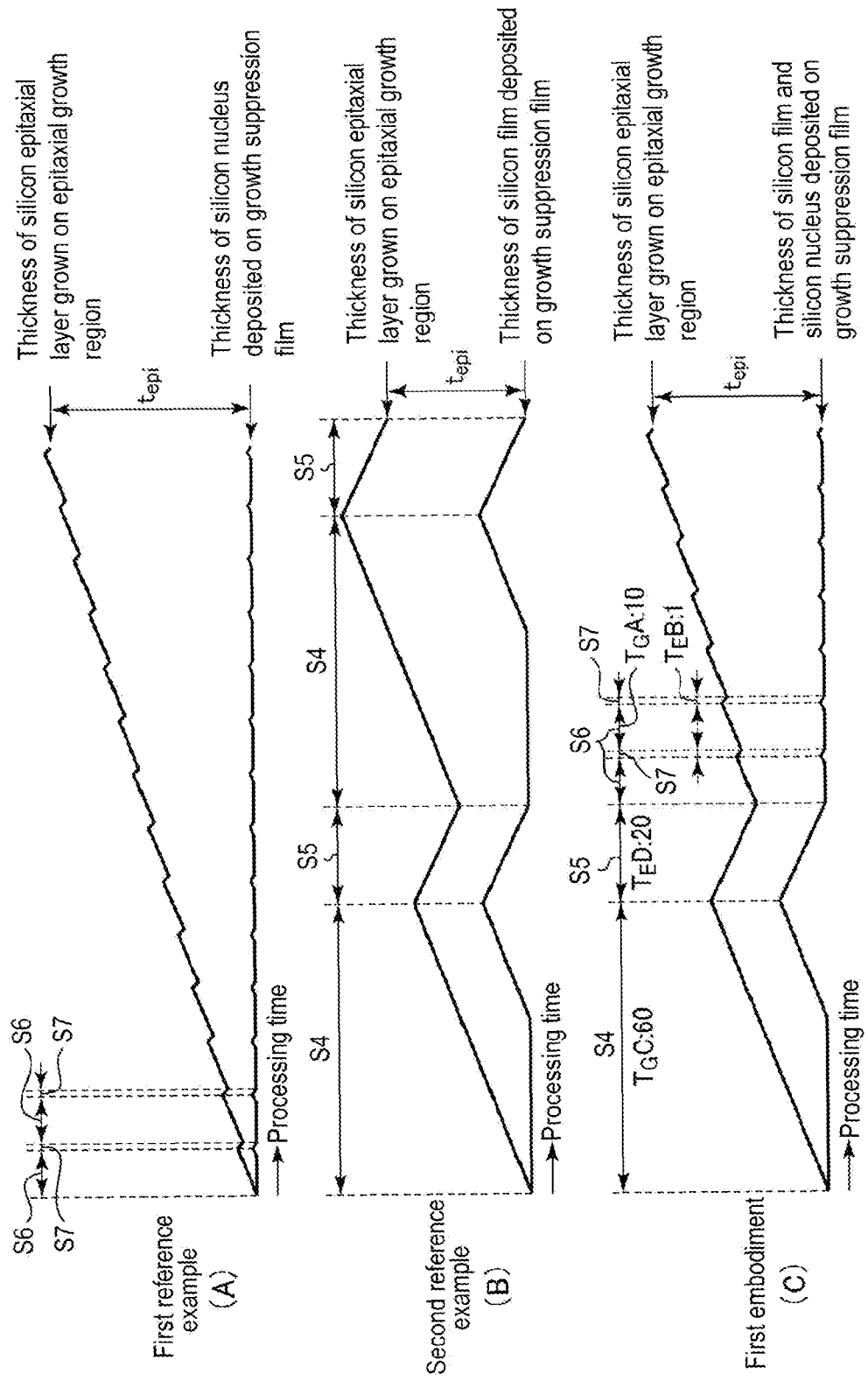

First reference example

First reference example

First embodiment

First embodiment

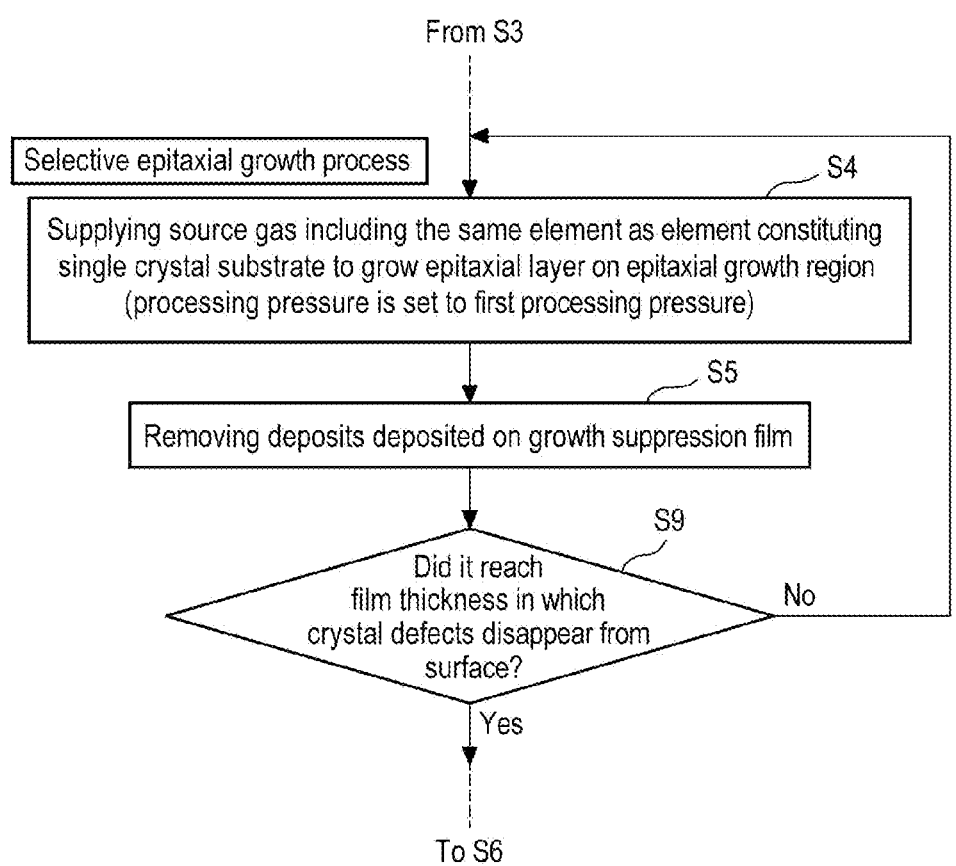

→ Minor axis direction

SELECTIVE EPITAXIAL GROWTH METHOD AND FILM FORMING APPARATUS

CROSS-REFERENCE TO RELATED APPLICATION

This application claims the benefit of Japanese Patent Application No. 2013-043995 filed on Mar. 6, 2013, in the Japan Patent Office, the disclosure of which is incorporated herein in its entirety by reference.

TECHNICAL FIELD

The present disclosure relates to a selective epitaxial growth method and a film forming apparatus.

BACKGROUND

A selective epitaxial growth method (hereinafter, referred to as SEG) of partitioning an epitaxial growth region on a single crystal substrate, for example, a silicon single crystal substrate, by a growth suppression film such as a silicon oxide film to selectively grow an epitaxial layer on the epitaxial growth region is known. A typical SEG method is described in a related art.

As is also described in the related art, in the SEG, for example, supply of a silicon source gas and supply of an etching gas are alternately repeated. That is, the silicon epitaxial layer is selectively grown on the epitaxial growth region, while repeating an epitaxial growth of silicon and etching of extra silicon deposited on an interlayer insulating film including the growth suppression film, for example, a silicon oxide film.

The SEG has been applied to a relatively wide shallow region (an aspect ratio of less than "1") like a so-called elevated source/drain structure which is obtained by selectively growing silicon, for example, on a source and drain region of MOSFET in a manufacturing process of a semiconductor integrated circuit device. However, recently, an application of the SEG to a relatively narrow and deep region (an aspect ratio of "1" or more), for example, burying a hole pattern, or a space pattern of line and space patterns has also been considered.

High integration of the semiconductor integrated circuit device still continues to progress. Therefore, in the hole pattern or the space pattern, a dimension in a plane direction tends to become narrower, and a dimension in a depth direction tends to become deeper. The aforementioned pattern is a so-called high aspect ratio of the hole pattern or the space pattern.

The burying of the hole pattern or the space pattern having such a high aspect ratio using the SEG requires a long processing time. The reason is that it is necessary to increase the number of repetitions of the epitaxial growth of silicon and etching of extra silicon. Therefore, degradation of throughput is inevitable when manufacturing the semiconductor integrated circuit device.

In order to solve the degradation of the throughput, it is conceivable to increase a growth rate of the silicon during its epitaxial growth. The increase in growth rate prevents an increase in processing time, even in burying the hole pattern or the space pattern having the high aspect ratio.

However, a problem occurs when changes in processing conditions such as a processing pressure during the epitaxial growth for the purpose of an increase in the growth rate. In these instances, crystalline orientation of a grown silicon epitaxial layer or a surface flatness thereof may degrade.

SUMMARY

The present disclosure provides a selective epitaxial growth method capable of inhibiting an increase of the processing time without degrading crystalline orientation of the epitaxial layer or surface flatness of the epitaxial layer, and a film forming apparatus capable of performing the selective epitaxial growth method.

According to one embodiment of the present disclosure, there is provided a selective epitaxial growth method of selectively growing an epitaxial layer, the method including preparing a target object to be processed including a single crystal substrate in which an epitaxial growth region is partitioned by a growth suppression film, and growing the epitaxial layer on the epitaxial growth region of the target object until a predetermined film thickness is obtained, wherein growing the epitaxial layer includes first source gas supply process of supplying a source gas containing the same element as an element of the single crystal substrate onto the target object under a first processing pressure to grow a first epitaxial layer on the epitaxial growth region, first removing process of removing deposits accumulated on the growth suppression film due to the supply of the source gas in the first source gas supply process, second source gas supply process of supplying the source gas onto the target object under a second processing pressure higher than the first processing pressure to grow a second epitaxial layer on the first epitaxial layer grown on the epitaxial growth region, and second removing process of removing the deposits accumulated on the growth suppression film due to the supply of the source gas in the second source gas supply process, wherein the second source gas supply process and the second removing process are repeated until the predetermined film thickness is obtained.

According to another embodiment of the present disclosure, there is provided a film forming apparatus including a processing chamber configured to accommodate a target object to be processed and to selectively grow an epitaxial layer on an epitaxial growth region of the accommodated target object, a processing gas supply mechanism configured to supply the processing chamber with a source gas of the epitaxial layer, and an etching gas which removes deposits accumulated on a growth suppression film partitioning the epitaxial growth region due to the source gas, an exhaust mechanism configured to exhaust the processing chamber, and a control device configured to control the gas supply mechanism and the exhaust mechanism, wherein the control device controls the gas supply mechanism and the exhaust mechanism according to the selective epitaxial growth method described above.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flow chart showing an example of a sequence of a selective epitaxial growth method according to a first embodiment of the present disclosure.

FIG. 4 is time charts, wherein a time chart A shows a relation between a processing time according to a first reference example and a thickness of a growing epitaxial layer, a time chart B shows a relation between a processing time according to a second reference example and a thickness of a growing epitaxial layer, and a time chart C shows a relation between a processing time according to a first embodiment and a thickness of a growing epitaxial layer.

FIG. 8 is a flow chart showing an example of a sequence of a selective epitaxial growth method according to a second embodiment of the present disclosure.

FIG. 9A is a perspective view showing an example of a hole pattern, while

FIG. 10A is a perspective view showing an example of a line-and-space pattern, while

DETAILED DESCRIPTION

Figure 2A:
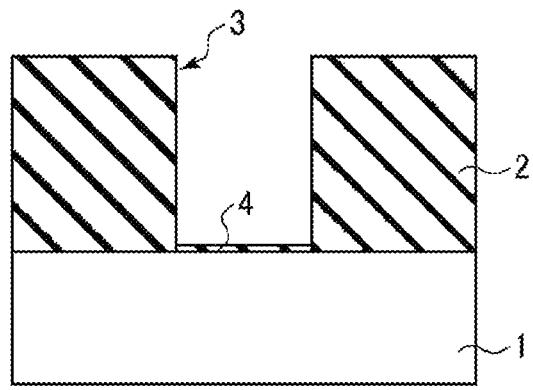
FIG. 2A schematically illustrates a state of a target object to be processed in the sequence, in a cross-sectional view.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. Further, common portions will be denoted by common reference numerals throughout the drawings.

First Embodiment

<Selective Epitaxial Growth Method>

FIG. 1 is a flow chart showing an example of a sequence of a selective epitaxial growth method according to a first embodiment of the present disclosure, and FIGS. 2A to 2L schematically illustrate states of a target object to be processed in the sequence, in cross-sectional views.

<Preparation of Target Object>

First, as shown in Step S1 of FIG. 1, a target object to be processed, which includes a single crystal substrate made of a seed crystal of the selective epitaxial growth and has epitaxial growth regions partitioned by a growth suppression film, is prepared.

In this example, as an example of the target object, a target object as illustrated in FIG. 2A is prepared, in which a single crystal silicon substrate (silicon wafer) 1 is selected as the single crystal substrate and an interlayer insulating film 2 as a growth suppression film is formed on the single crystal silicon substrate 1. A material of the interlayer insulating film 2 is, for example, a silicon oxide film, a silicon nitride film or the like. A hole pattern 3 reaching the single crystal silicon substrate 1 is formed on the interlayer insulating film 2. In the actual semiconductor integrated circuit device, for example, the hole pattern 3 is an opening that functions as, for example, a contact hole or the like. The interlayer insulating film 2 formed with the hole pattern 3 partitions the epitaxial growth region on the single crystal silicon substrate 1. That is, in this example, a portion of the single crystal silicon substrate 1 exposed at a bottom of the hole pattern 3 becomes an epitaxial growth region.

<Preprocessing of Selective Epitaxial Growth>

Next, before starting the selective epitaxial growth, preprocessing for the selective epitaxial growth is performed. This preprocessing may be performed as needed.

As illustrated in FIG. 2A, for example, after the hole pattern 3 is formed through the interlayer insulating film 2 using an etching apparatus, the single crystal silicon substrate 1 is carried out of the etching apparatus. When the carried-out single crystal silicon substrate 1 is exposed to an atmosphere including oxygen, e.g., an atmospheric environment, a natural oxide film 4 is grown on a surface of the single crystal silicon substrate 1 exposed at the bottom of the hole pattern 3, i.e., on an epitaxial growth region.

Figure 2B:
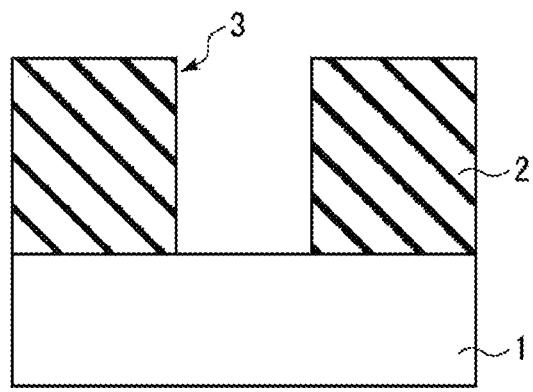
FIG. 2B schematically illustrates a state of the target object in the sequence, in a cross-sectional view.

In the preprocessing, as a first step, as shown in Step S2 of FIG. 1, the natural oxide film 4 is removed from the epitaxial growth region. Thus, as illustrated in FIG. 2B, the single crystal silicon substrate 1 is exposed in the epitaxial growth region. Methods for removing the natural oxide film 4 include both a dry process and a wet process, a chemical oxide removal (COR) process may be adopted as an example of the former, and a dilute hydro fluoric acid (DHF) process may be adopted as an example of the latter.

Figure 2C:
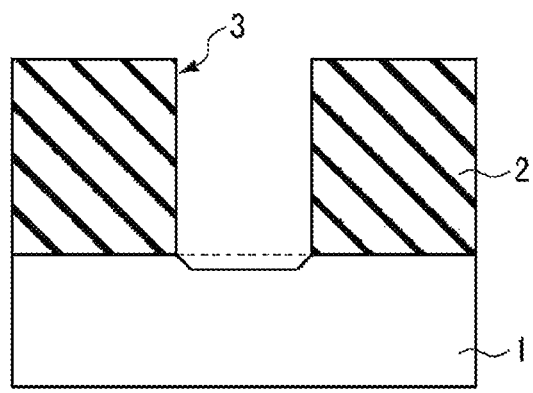
FIG. 2C schematically illustrates a state of the target object in the sequence, in a cross-sectional view.

Next, as a second step, as shown in Step S3 of FIG. 1, the epitaxial growth region is recessed. Thus, as illustrated in FIG. 2C, a portion of the single crystal silicon substrate 1 corresponding to the epitaxial growth region is shallowly recessed, and damages (crystal defects) introduced into the single crystal silicon substrate 1 exposed at the bottom of the hole pattern 3, e.g., when the hole pattern 3 is formed, are removed.

<Selective Epitaxial Growth Process>

When the preprocessing is finished, a selective epitaxial growth process begins.

Figure 2D:
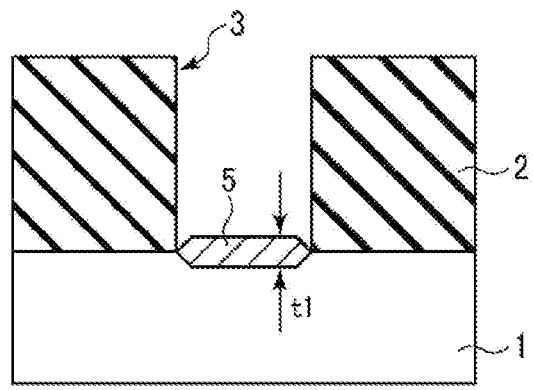
FIG. 2D schematically illustrates a state of the target object in the sequence, in a cross-sectional view.
Figure 2E:
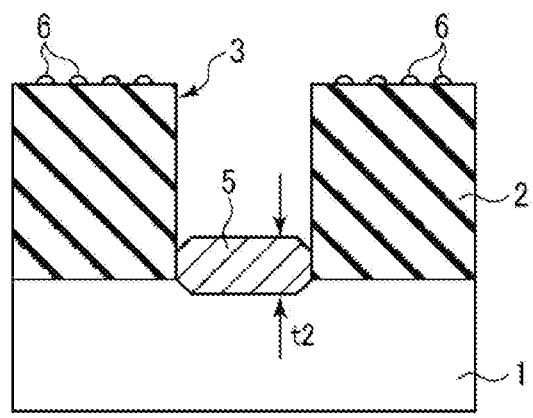
FIG. 2E schematically illustrates a state of the target object in the sequence, in a cross-sectional view.
Figure 2F:
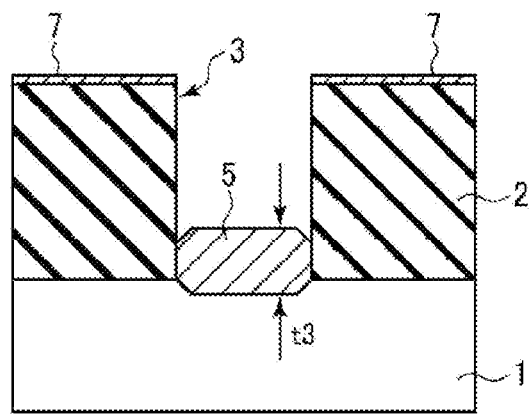
FIG. 2F schematically illustrates a state of the target object in the sequence, in a cross-sectional view.

In the selective epitaxial growth step, first, as shown in Step S4 of FIG. 1, a source gas containing the same element as an element constituting the single crystal substrate is supplied to grow an epitaxial layer on the epitaxial growth region. In this example, a silicon source gas containing the same silicon as silicon constituting the single crystal silicon substrate 1 is supplied to a processing chamber of a film forming apparatus accommodating the single crystal silicon substrate 1 to grow a silicon epitaxial layer 5 on the epitaxial growth region in the processing chamber, as illustrated in FIGS. 2D to 2F. An example of the silicon source gas includes monosilane gas ($SiH_4$).

Epitaxial growth conditions in Step S4 are set to conditions in which a beginning time of deposition of silicon on the interlayer insulating film 2 (delay time) is significantly delayed compared with a beginning time of growth of the silicon epitaxial layer 5 on the single crystal silicon substrate 1. As an example of such conditions, it is possible to suppress a processing pressure at a lower value. In this example, the processing pressure in Step S4 is set to a first processing pressure. An example of the first processing pressure and the specific processing conditions is as follows:

Flow rate of monosilane: 40 sccm
Processing time: 60 min
Processing temperature: 550 degrees C.
First processing pressure: 0.03325 Pa ($2.5 \times 10^{-4}$ Torr; 1 Torr is set to 133 Pa in this specification)

In the above-described conditions, a growth rate of the silicon epitaxial layer 5 becomes slower than a case of being set to a value exceeding the first processing pressure. However, it is possible to significantly delay the beginning time of deposition of silicon onto the interlayer insulating film 2.

FIGS. 2D to 2F illustrate growth processes of the silicon epitaxial layer 5.

FIG. 2D illustrates an initial stage of growth, wherein the silicon epitaxial layer 5 of a thickness t1 is being grown on the single crystal silicon substrate 1, but a deposit, for example, deposition of silicon does not occur on the interlayer insulating film 2.

Subsequent FIG. 2E illustrates an intermediate stage of growth. In the intermediate stage of growth, the silicon epitaxial layer 5 is grown to a thickness t2 thicker than the thickness t1. For example, at a stage where the layer is grown to the thickness t2, a nucleus of the deposit, for example, a nucleus 6 of silicon begins to occur on the interlayer insulating film 2.

When the growth of the silicon epitaxial layer 5 continues, as illustrated in FIG. 2F, the silicon epitaxial layer 5 is grown to a thickness t3 thicker than the thickness t2. At the same time, the deposition proceeds such that the nucleus 6 of silicon located on the interlayer insulating film 2 becomes larger, or forms a layered silicon film 7.

Figure 2G:
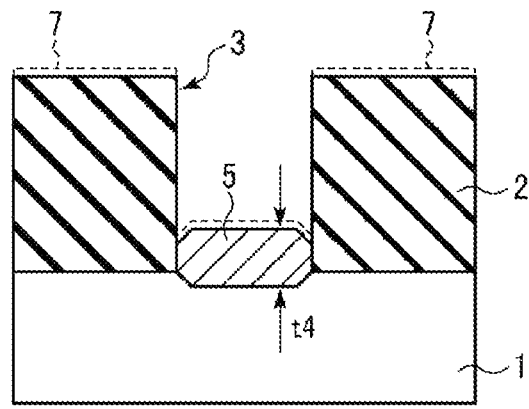
FIG. 2G schematically illustrates a state of the target object in the sequence, in a cross-sectional view.

Next, as shown in Step S5 of FIG. 1, deposits accumulated on a growth suppression film are removed. In this example, an etching gas for etching the layered silicon film 7 deposited on the interlayer insulating film 2 is supplied into the processing chamber to remove the layered silicon film 7 by etching, as illustrated in FIG. 2G. An example of the etching gas includes chlorine ($Cl_2$) gas. For example, using a hydrogen ($H_2$) gas as a carrier gas, the chlorine gas is supplied into the processing chamber together with the hydrogen gas.

An example of specific processing conditions in Step S5 is as follows:

Flow rate of chlorine gas: 80 sccm
Flow rate of hydrogen gas: 1000 sccm
Processing time: 20 min
Processing temperature: 550 degrees C.
Processing pressure: 0.03325 Pa ($2.5 \times 10^{-4}$ Torr)

Thus, the layered silicon film 7 deposited on the interlayer insulating film 2 is removed. At the same time, since the silicon epitaxial layer 5 includes the same silicon in kind as the layered silicon film 7, the surface of the silicon epitaxial layer 5 is also etched to retreat while the thickness thereof is reduced to a thickness t4 thinner than the thickness t3. In this respect, a growth time of the silicon epitaxial layer 5 is set to a time during which the silicon epitaxial layer in Step S4 is thick enough to remain even after Step S5, and a removal time in Step S5 is set to an estimated time during which the removal of the layered silicon film 7 deposited on the interlayer insulating film 2 will be completed. Thus, the silicon epitaxial layer 5 remains even after Step S5.

As described above, in the first embodiment, in spite of the selective epitaxial growth method, the initially grown silicon epitaxial layer 5 is thickly grown, for example, until a large silicon nucleus is generated, for example, on the interlayer insulating film 2, or until deposition of the layered silicon film 7 begins as illustrated in FIG. 2F. The reason is as follows.

FIGS. 3A to 3E are enlarged views illustrating the vicinity of the epitaxial growth region in cross-sectional views.

Figure 3A:
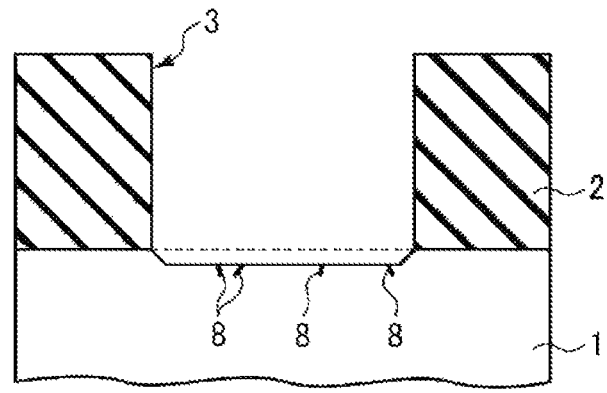
FIG. 3A is an enlarged view illustrating a vicinity of an epitaxial growth region, in a cross-sectional view.

As illustrated in FIG. 3A, in the first embodiment, in order to remove damage or crystal defects 8 generated in the single crystal silicon substrate 1 exposed at the bottom of the hole pattern 3, the single crystal silicon substrate 1 is recessed as described with reference to FIG. 2C. However, the damage or the crystal defects 8 may not be completely removed. Thousands to tens of thousands of hole patterns exist in the semiconductor integrated circuit device, and there may be a possibility for the damage or the crystal defects 8 to remain at any one position somewhere.

Figure 3B:
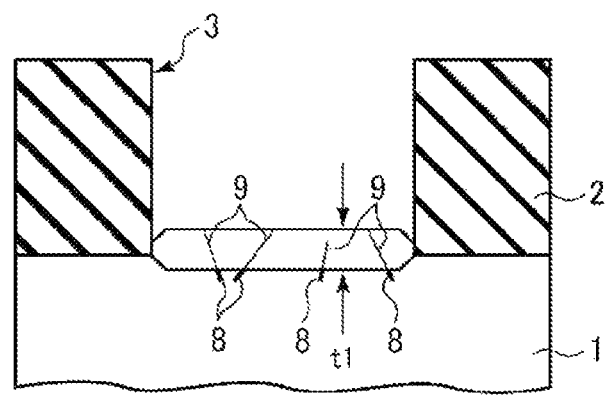
FIG. 3B is an enlarged view illustrating a vicinity of an epitaxial growth region, in a cross-sectional view.

When growing the silicon epitaxial layer 5 on such a single crystal silicon substrate 1, the crystal defects 8 existing in the epitaxial growth region grow into the silicon epitaxial layer 5. As illustrated in FIG. 3B, in the initial growth of the silicon epitaxial layer 5, the crystal defects 9 that have grown into the silicon epitaxial layer 5 reach the surface of the silicon epitaxial layer 5.

Figure 3C:
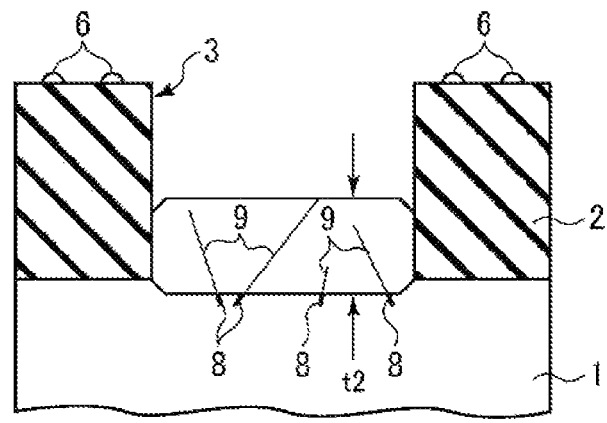
FIG. 3C is an enlarged view illustrating a vicinity of an epitaxial growth region, in a cross-sectional view.

However, when the growth of the silicon epitaxial layer 5 continues, as illustrated in FIG. 3C, the crystal defects 9 that have grown therein gradually disappear.

Figure 3D:
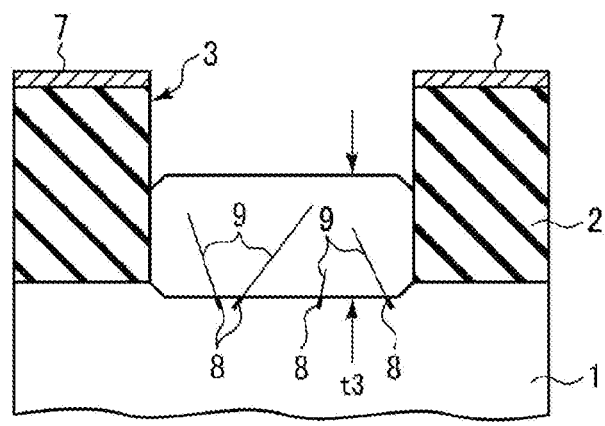
FIG. 3D is an enlarged view illustrating a vicinity of an epitaxial growth region, in a cross-sectional view.
Figure 3E:
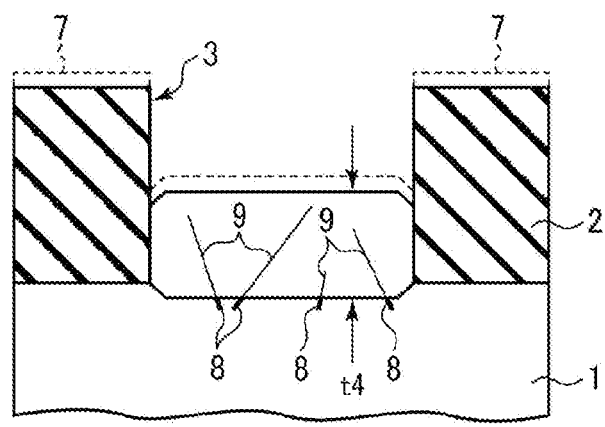
FIG. 3E is an enlarged view illustrating a vicinity of an epitaxial growth region, in a cross-sectional view.

When continuing the growth of the silicon epitaxial layer 5, as illustrated in FIG. 3D, the crystal defects 9 disappear from the surface of the silicon epitaxial layer 5. In addition to a consideration of the disappearance of the crystal defects 9, a removal amount of the silicon epitaxial layer 5 in subsequent Step S5 is also considered in setting the thickness of the silicon epitaxial layer 5 in Step S4. As illustrated in FIG. 3E, the thickness in Step 4 is set to a thickness t3 so that the thickness of the silicon epitaxial layer 5 after the retreat by etching remains in a thickness t4, and at the same time the crystal defects 9 do not exist on the surface of the retreated silicon epitaxial layer 5.

Thus, in the first embodiment, a thickness of the initially grown silicon epitaxial layer 5 is set to an extent in which the crystal defects 9 disappear from the surface of the silicon epitaxial layer 5 obtained after Step 5, wherein the crystal defects 9 are developed from the crystal defects 8 existing in the epitaxial growth region to grow into the silicon epitaxial layer 5. Thus, a silicon epitaxial layer having high quality in which crystal defects hardly exist therein can be obtained from a silicon epitaxial layer whose growth has been continuously repeated.

Figure 2H:
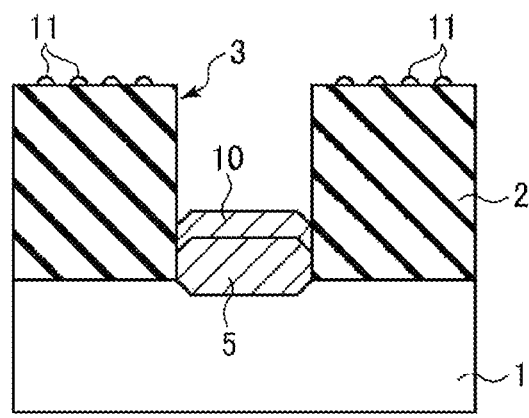
FIG. 2H schematically illustrates a state of the target object in the sequence, in a cross-sectional view.

Next, as shown in Step S6 of FIG. 1, the source gas is supplied to grow a new epitaxial layer on the epitaxial growth region. In this example, a $SiH_4$ gas is supplied into the processing chamber of the film forming apparatus accommodating the single crystal silicon substrate 1 to grow a new silicon epitaxial layer 10 on the epitaxial growth region, as illustrated in FIG. 2H.

Compared to Step S4, epitaxial growth conditions in Step S6 may be set to conditions in which a beginning time (delay time) of deposition of silicon onto the interlayer insulating film 2 becomes smaller. An example of such conditions may include a higher processing pressure than the processing pressure in the Step S4. In this example, the processing pressure in Step S6 is set to a second processing pressure higher than the first processing pressure. As an example of the second processing pressure and specific processing conditions is as follows:
 Flow rate of monosilane: 90 sccm
 Processing time: 10 min
 Processing temperature: 550 degrees C.
 First processing pressure: 0.0665 Pa ($5\times10^{-4}$ Torr)

In the above-described conditions, the deposition of silicon onto the interlayer insulating film 2 is accelerated as compared to Step S4, but a growth rate of a new silicon epitaxial layer 10 can be accelerated compared to a growth rate of the silicon epitaxial layer 5 in Step S4.

Figure 2I:
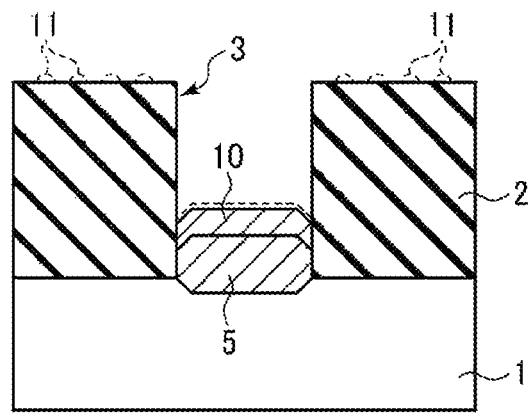
FIG. 2I schematically illustrates a state of the target object in the sequence, in a cross-sectional view.

Next, as shown in Step S7 of FIG. 1, the deposits accumulated on the growth suppression film are removed. In this example, an etching gas for etching a granular silicon nucleus 11 deposited on the interlayer insulating film 2 is supplied into the processing chamber to remove the granular silicon nucleus 11, as illustrated in FIG. 2I. An example of the etching gas includes chlorine ($Cl_2$) gas. As in Step S5, for example, hydrogen ($H_2$) gas is used as a carrier gas, and the chlorine gas is supplied into the processing chamber together with hydrogen gas.

An example of specific processing conditions in Step S7 is as follows:
 Flow rate of chlorine gas: 80 sccm
 Flow rate of hydrogen gas: 1000 sccm
 Processing time: 1 min
 Processing temperature: 550 degrees C.
 Processing pressure: 0.0665 Pa ($5\times10^{-4}$ Torr)

Thus, the granular silicon nucleus 11 on the interlayer insulating film 2 is removed. At the same time, since a new silicon epitaxial layer 10 includes silicon of the same kind as the granular silicon nucleus 11, a surface of the new silicon epitaxial layer 10 is also etched and retreats. In this respect, a growth time of the new silicon epitaxial layer 10 is set to a time during which the new silicon epitaxial layer 10 in Step 6 is thick enough to remain even after Step S7, and a removal time in Step S7 is set to an estimated time during which the removal of the granular silicon nucleus 11 will be completed. Thus, even after Step S7, the new silicon epitaxial layer 10 remains.

Next, as shown in Step S8 of FIG. 1, it is determined whether the film thickness reaches a designed film thickness. In this embodiment, it is determined whether a total film thickness of the silicon epitaxial layer 5 and the new silicon epitaxial layer 10 reaches a designed film thickness.

Figure 2J:
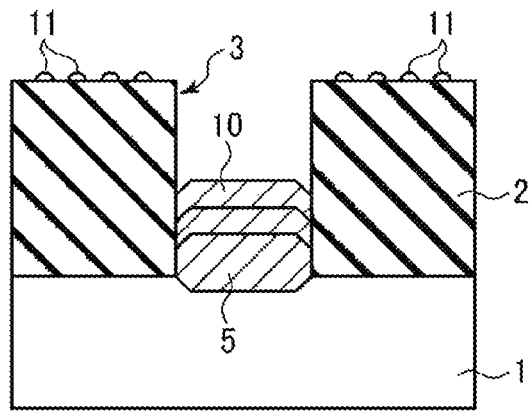
FIG. 2J schematically illustrates a state of the target object in the sequence, in a cross-sectional view.
Figure 2K:
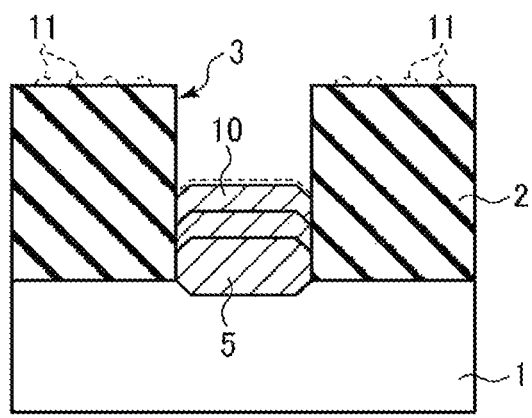
FIG. 2K schematically illustrates a state of the target object in the sequence, in a cross-sectional view.

When it is determined that the film thickness does not reach a designed film thickness (NO), the process returns to Step S6, the growth of the new silicon epitaxial layer 10, and the removal of the deposits accumulated on the interlayer insulating film 2 in Step S7, i.e., the removal of the granular silicon nucleus 11 in this example, are performed (see FIGS. 2J to 2K).

Further, when it is determined that the film thickness reaches a designed film thickness (YES), the process of the selective epitaxial growth method according to the first embodiment is finished.

Figure 2L:
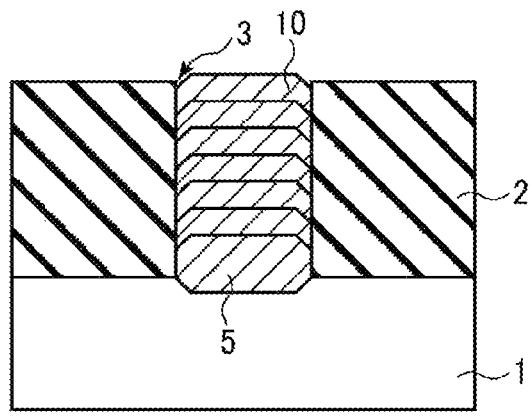
FIG. 2L schematically illustrates a state of the target object in the sequence, in a cross-sectional view.

Thus, by repeating Step S6 and Step S7 until the film thickness reaches a designed film thickness, for example, the epitaxial silicon layers 5 and 10 are selectively grown in the interior of the hole pattern 3 formed through the interlayer insulating film 2, as illustrated in FIG. 2L.

FIG. 4 is time charts illustrating a relation between a processing time and a thickness of the growing silicon epitaxial layer, wherein a chart A shows a first reference example, a chart B shows a second reference example, and a chart C shows a first embodiment. Further, FIG. 4 shows a thickness of the silicon epitaxial layer grown on the epitaxial growth region and a thickness (silicon film or silicon nucleus) of deposits accumulated on the growth suppression film (interlayer insulating film 2). In addition, a beginning time (delay time) at which the deposition of silicon begins on the growth suppression film (interlayer insulating film 2) is also illustrated.

A first reference example shown in chart A of FIG. 4 is a reference example where a growth rate is given a higher importance, and since the processing conditions for growing the silicon epitaxial layer are in accordance with the processing conditions in Steps S6 and S7 of the first embodiment, these conditions are repeated.

Figure 5A:
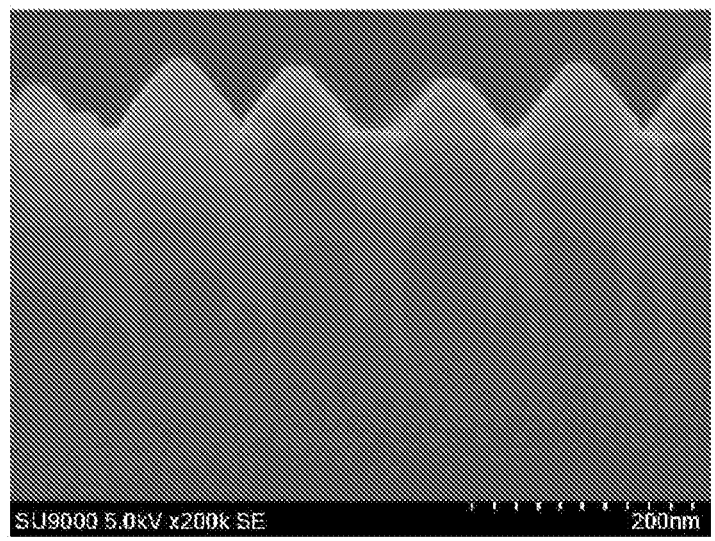
FIGS. 5A and 5B are photographs showing results of the first reference example.
Figure 5B:
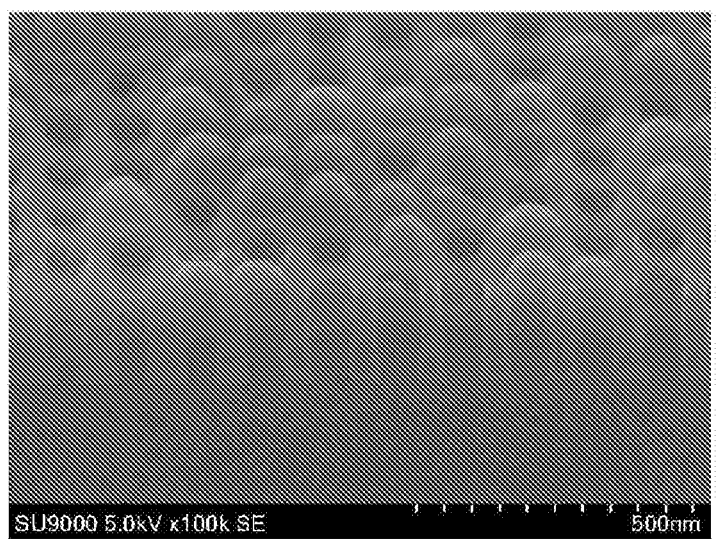

In the first reference example, a thickness $t_{epi}$ of the silicon epitaxial layer which means a thickness grown per unit processing time is the thickest. Accordingly, this is an example in which the best effect is obtained in view of suppression of an increase in the processing time and an improvement in the throughput. However, in the first reference example, a problem such as degradation of crystalline orientation of the grown silicon epitaxial layer or surface flatness thereof was confirmed. FIGS. 5A and 5B show transmission microphotographs thereof. FIG. 5A shows a cross-section, and FIG. 5B shows a cross-section and a plane.

FIGS. 5A and 5B show a silicon epitaxial layer that is selectively grown within the hole pattern, wherein unevenness is observed in heights of the silicon epitaxial layer, and there are a silicon epitaxial layer that is grown to the top of the hole pattern and a silicon epitaxial layer that is not grown to the top of the hole pattern. It is speculated that crystalline orientation of the grown silicon epitaxial layer degrades and its surface flatness is also made bad as a result.

An example highlighting and accounting for the crystalline orientation rather than the growth rate, considering the results of the first reference example, is a second reference example shown in the chart B of FIG. 4. Processing conditions for growing the silicon epitaxial layer are in accordance with the processing conditions of Steps S4 and S5 of the first embodiment, and these conditions are repeated. In the second reference example, a thickness $t_{epi}$ of the silicon epitaxial layer, which means a thickness grown per unit processing time, is the thinnest. For this reason, it may be said that the conditions hardly contribute to suppression of an increase in the processing time and an improvement in the throughput. However, in the second reference example, the grown silicon epitaxial layer has a good crystalline orientation and not degraded surface flatness.

Figure 6A:
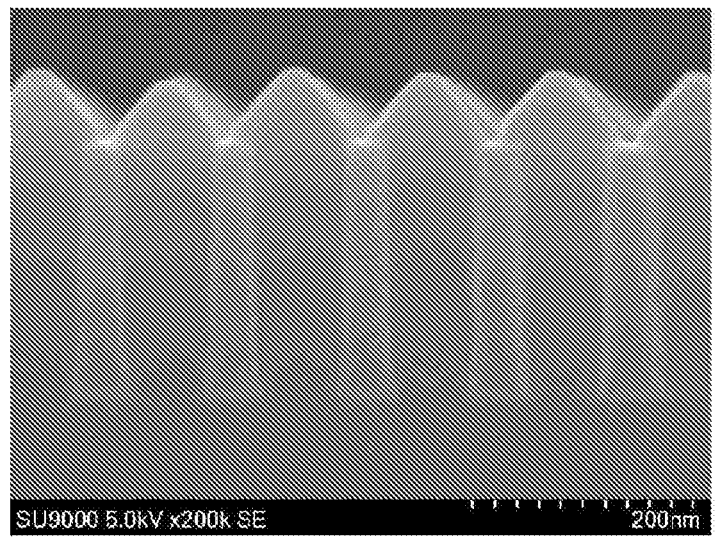
FIGS. 6A and 6B are photographs showing results of the first embodiment.
Figure 6B:
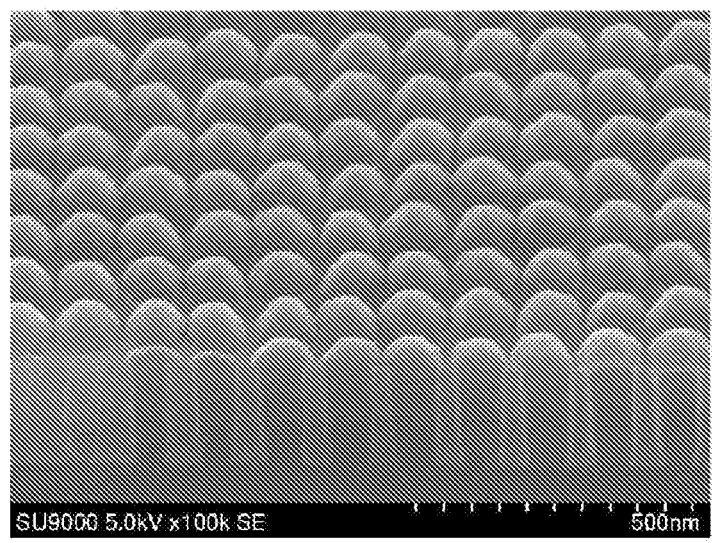

The first embodiment shown in the chart C of FIG. 4 was made from the knowledge obtained from the first reference example and the second reference example. In the first embodiment, the thickness $t_{epi}$ of the silicon epitaxial layer which means a thickness grown per unit processing time does not reach the first reference example, but becomes remarkably thicker compared to the second reference example. Moreover, the crystalline orientation of the grown silicon epitaxial layer is excellent, similar to the second reference example, and degradation of the flatness of the surface was not observed, either. FIGS. 6A and 6B show the transmission microphotographs. FIG. 6A shows a cross-section, and FIG. 6B shows a cross-section and a plane.

As shown in FIGS. 6A and 6B, unevenness was not really observed in the heights of the silicon epitaxial layer that is selectively grown within the hole pattern, and the silicon epitaxial layer is grown to the top of all the hole patterns. It is estimated that the degradation of the crystalline orientation of the grown silicon epitaxial layer is suppressed, and, as a result, a good surface flatness is obtained.

Therefore, according to the selective epitaxial growth method of the first embodiment, it is possible to obtain a selective epitaxial growth method capable of preventing an increase in the processing time without degrading the surface flatness or the crystalline orientation of the epitaxial layer.

<Relation Between Growth Time and Removal Time>

As shown in FIG. 4, in the first embodiment, a ratio $T_GA/T_EB$ of a growth time $T_GA$ of the silicon epitaxial layer in Step S6 to a removal time $T_EB$ of the deposits in Step S7 is set to 10/1. In addition, a relation of a ratio $T_GC/T_ED$ of a growth time $T_GC$ of the epitaxial layer in Step S4 to a removal time $T_ED$ of the deposits in Step S5 is set to 60/20=3/1.

In this way, by setting a relation of the ratios of the growth times and the removal times to "$T_GA/T_EB > T_GC/T_ED$", Steps S6 and S7 (in which more steps are repeated than Steps S4 and S5) can secure a shortened removal time and a lengthened growth time as compared to Steps S4 and S5. Therefore, it is possible to obtain an advantage in that an amount of the silicon epitaxial layer being removed in Step S7 is reduced, thereby allowing more silicon epitaxial layers to remain. By allowing more silicon epitaxial layers to remain after Step S7, it is possible to increase the growth rate of the silicon epitaxial layer per one round of Steps S6 and S7. Therefore, when the selective epitaxial growth method according to the first embodiment is applied to a method of manufacturing a semiconductor integrated circuit device, it is possible to increase the productivity of the semiconductor integrated circuit device.

<Saturation of Growth Rate>

Figure 7:
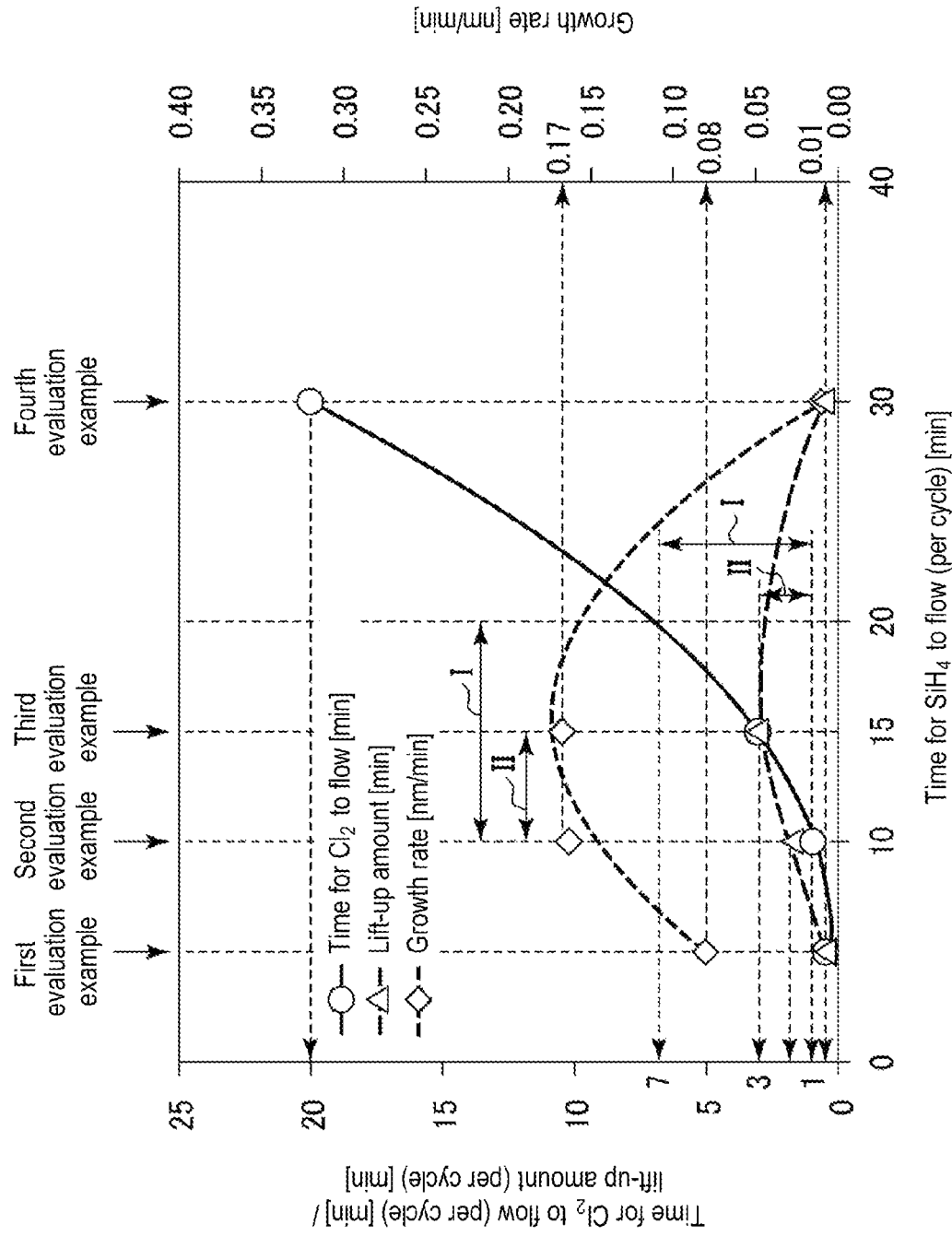
FIG. 7 is a view showing a relation between a time for allowing a silicon source gas and an etching gas to flow per cycle and a growth rate.

FIG. 7 is a diagram showing a relation between a time for the silicon source gas and the etching gas to flow per cycle and the growth rate.

In an evaluation of this example, the time during which the silicon source gas and the etching gas flow was changed under conditions of a processing temperature of 550 degrees C., a processing pressure of 0.0665 Pa, a flow rate of monosilane ($SiH_4$) gas of 90 sccm as the silicon source gas, and a flow rate of chlorine ($Cl_2$) gas of 80 sccm as the etching gas, wherein hydrogen ($H_2$) gas as a carrier gas for chlorine gas is caused to flow at a rate of 1000 sccm.

(First Evaluation Example)
<Conditions>
Silicon source gas: 5 min (per cycle)
Etching gas: 0.5 min (per cycle)
A cycle time of the first evaluation example is 5.5 min (=5 min+0.5 min). In the first evaluation example, a silicon epitaxial layer of about 0.44 nm was selectively grown in the hole pattern (hereinafter, an amount of silicon film selectively grown in the hole pattern will be referred to as "lift-up amount"). Thus, the growth rate is about 0.08 nm/min (=0.44 nm/5.5 min).

(Second Evaluation Example)
<Conditions>
Silicon source gas: 10 min (per cycle)
Etching gas: 1 min (per cycle)
A cycle time of the second evaluation example is 11 min (=10 min+1 min). In the second evaluation example, the lift-up amount was about 1.8 nm. Thus, the growth rate is about 0.163 nm/min (=1.8 nm/11 min).

(Third Evaluation Example)
<Conditions>
Silicon source gas: 15 min (per cycle)
Etching gas: 3 min (per cycle)
A cycle time of the third evaluation example is about 18 min (=15 min+3 min). In the third evaluation example, the lift-up amount was about 3 nm. Thus, the growth rate is about 0.167 nm/min (=3 nm/18 min).

(Fourth Evaluation Example)
<Conditions>
Silicon source gas: 30 min (per cycle)
Etching gas: 20 min (per cycle)
A cycle time of the fourth evaluation example is 50 min (=30 min+20 min). In the fourth evaluation example, the lift-up amount was about 0.5 nm. Thus, the growth rate is about 0.01 nm/min (=0.5 nm/50 min).

If the time for the silicon source gas to flow increases, the silicon epitaxial layer is thickly grown in the hole pattern. However, the film formation also proceeds on the interlayer insulating film (growth suppression film) accordingly. In order to achieve the selective epitaxial growth in the hole pattern, it is necessary to etch silicon deposits on the interlayer insulating film.

If the time for the silicon source gas to flow increases, silicon is of course thickly deposited on the interlayer insulating film. Therefore, if the time for the silicon source gas to flow increases, it is necessary to also increase the time for the etching gas to flow. When increasing the time for the etching gas to flow, the silicon epitaxial layer grown on the hole pattern is etched in a significant amount. For this reason, the thickness of the silicon epitaxial layer remaining in the hole pattern after etching is changed from an increase to a decrease via a certain turning point. That is, the growth rate when silicon is selectively epitaxial-grown in the hole pattern is saturated at a certain stage. This is shown in first to fourth evaluation examples.

In the first to fourth evaluation examples, the growth rate when silicon is selectively epitaxial-grown in the hole pattern is saturated at substantially 0.16 to 0.17 nm/min. As shown in the first to fourth evaluation examples, it is preferred that the actual selective epitaxial growth be performed under the conditions near the conditions in which the growth rate is saturated.

Further, although the example of FIG. 7 shows the relation between the growth rates in Steps S6 and S7, an identical tendency also exists in Steps S4 and S5. In the example shown in FIG. 7, the conditions in which the growth rate is saturated are a time for the silicon source gas to flow of 10 to 20 min per cycle, and a time for the etching gas to flow of 1 to 7 min per cycle (range I in FIG. 7).

Further, in the results shown in FIG. 7, it can be understood that the growth rate is saturated near the time for the silicon source gas to flow of 15 min per cycle. In this specification, this is referred to as a peak saturation growth rate. In order to shorten the processing time, it is preferable in some embodiments to complete "growth of the silicon epitaxial layer" and "etching of the deposits" in a shorter cycle time.

From this point of view, as more preferable conditions, the time for the silicon source gas to flow is 10 to 15 min per cycle, and the time for the etching gas to flow is 1 to 3 min per cycle (range II in FIG. 7). That is, it is preferable to select conditions in which the growth time of the silicon epitaxial layer and the removal time of the deposits become shorter, based on the peak growth rate. In this example, the cycle of "growth of the silicon epitaxial layer" and "etching of the deposits" may be terminated at the shortest time of 11 min or more and the longest time of 18 min or less.

Second Embodiment

In the above-described first embodiment, the thickness of the silicon epitaxial layer 5 was set to a thickness that allows the crystal defects 9, which are grown into the epitaxial layer from the crystal defects 8 in the epitaxial growth region, to disappear from the surface of the silicon epitaxial layer 5 obtained after Step S5.

On the other hand, the growth of the silicon epitaxial layer 5 is not terminated in only one cycle of Steps S4 and S5, and it is also possible to repeat Steps S4 and S5 several times, for example, two or three times. The second embodiment is an example in which Steps S4 and S5 are repeated multiple times to grow the silicon epitaxial layer 5.

FIG. 8 is a flowchart showing an example of a sequence of the selective epitaxial growth method according to a second embodiment of the present disclosure. Further, FIG. 8 only shows Steps S4, S5 and S9 to be inserted between Step S3 and Step S6 in the flowchart of FIG. 1.

In the second embodiment, as shown in Step S9 of FIG. 8, when Step S5 described in the first embodiment is completed, it is determined whether a thickness reaches a required film thickness in which the crystal defects disappear from the surface.

When it is determined that the thickness does not reach the required film thickness (NO), returning to Step S4, the growth of the silicon epitaxial layer 5 and the removal of the deposits accumulated on the interlayer insulating film 2 in Step S5, i.e., the removal of the layered silicon film 7 in this example, are performed.

Further, when it is determined that the required film thickness is obtained (YES), the process proceeds to Step S6 described in the first embodiment.

In this way, it is also possible to repeat Steps S4 and S5 multiple times to grow the silicon epitaxial layer 5. In this case, the determination of whether to terminate the growth of the silicon epitaxial layer 5 may be performed by determining whether the required film thickness is obtained, in which the crystal defects 9 disappear from the surface of the silicon epitaxial layer 5, which are grown from the crystal defects 8 existing in the epitaxial growth region.

That is, Steps S4 and S5 may be repeated until the thickness of the silicon epitaxial layer 5 remaining after Step S5 becomes the required thickness in which the crystal defects 9 disappear from the surface of the silicon epitaxial layer 5 obtained after Step S5, which are grown into the silicon epitaxial layer 5 from the crystal defects 8.

In the second embodiment as described above, it is also possible to obtain the same advantages as in the first embodiment. Further, in comparison with the first embodiment, growing the silicon epitaxial layer 5 in more than two cycles in the second embodiment, makes it possible for the crystal defects 9 to surely disappear from the surface of the silicon epitaxial layer 5 even if the crystal defects 9 that do not disappear from the surface in one cycle remain. Therefore, it is possible to obtain further advantages that the silicon epitaxial layer of high crystalline orientation and high quality can be selectively epitaxial-grown in the hole pattern.

<Applicable Pattern>

Figure 9A:
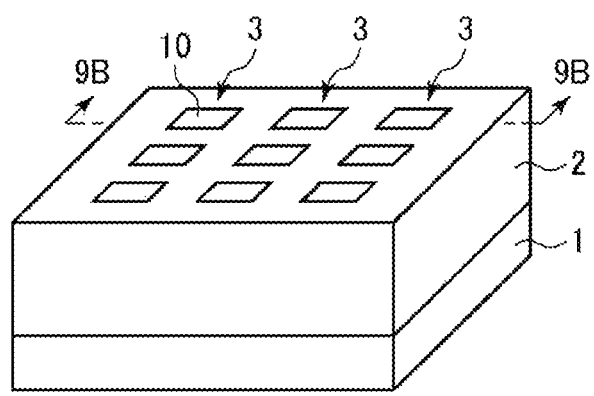
Figure 9B:
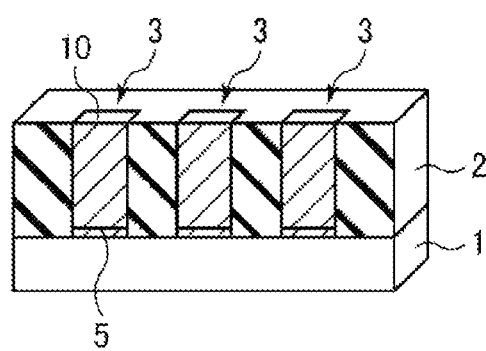
FIG. 9B is a perspective view showing a cross-section taken along a line 9B-9B in FIG. 9A.

FIG. 9A is a perspective view showing an example of a hole pattern, and FIG. 9B is perspective view illustrating a cross-section taken along a line 9B-9B of FIG. 9A.

In the above-described first and second embodiments, an example of performing the selective epitaxial growth of the silicon epitaxial layers 5 and 10 within the hole pattern 3 formed through the interlayer insulating film 2 has been described, as illustrated in FIGS. 9A and 9B. However, the above-described first and second embodiments are not applied only to the hole pattern 3.

Figure 10A:
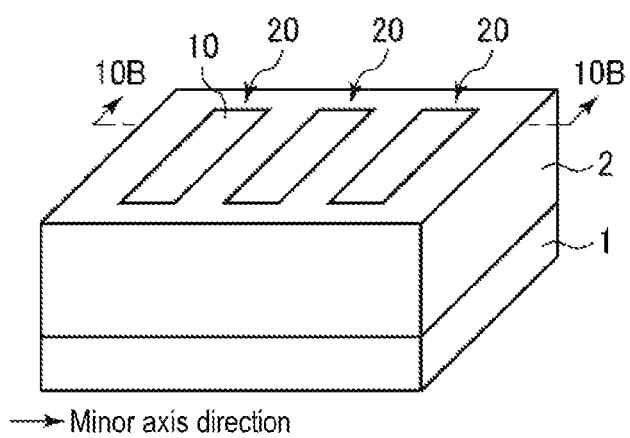
Figure 10B:
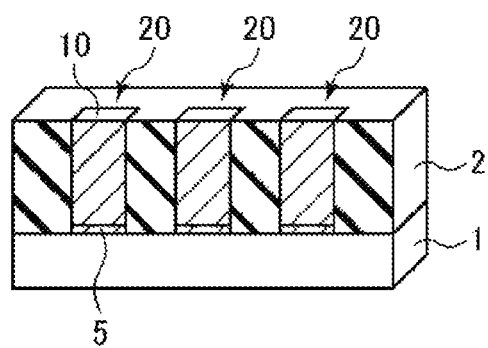
FIG. 10B is a perspective view showing a cross-section taken along a line 10B-10B in FIG. 10A.

FIG. 10A is a perspective view showing an example of a line-and-space pattern, and FIG. 10B is a perspective view illustrating a cross-section taken along a line 10B-10B of FIG. 10A.

The above-described first and second embodiment are applicable in a case where a line-and-space pattern is formed through the interlayer insulating film 2, as illustrated in FIGS. 10A and 10B. The interlayer insulating film 2 partitions the epitaxial growth region on the single crystal silicon substrate 1 into a line-and-space pattern shape. In the line-and-space pattern, a space pattern 20 has its cross-section along a minor axis direction matching the hole pattern 3. Therefore, the above-described first and second embodiments are also applicable to a case of performing the selective epitaxial growth of the silicon epitaxial layers 5 and 10 within the space pattern 20 in the line-and-space pattern.

<Aspect Ratio of Pattern>

FIGS. 11A to 11D are perspective views illustrating a cross-section of the hole pattern or the space pattern.

The selective epitaxial growth method according to the first and second embodiments may selectively grow the thick silicon epitaxial layers 5 and 10 within the hole pattern or the space pattern in a shortened processing time. Therefore, the selective epitaxial growth method according to the first and second embodiments is particularly effective for burying the hole pattern or the space pattern of a high aspect ratio which generally demands a reasonable time to bury. The high aspect ratio refers to an aspect ratio of "1" or more herein.

Figure 11A:
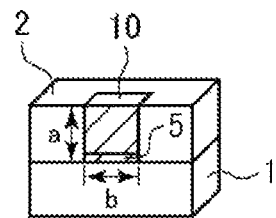
FIGS. 11A to 11D are perspective views showing a cross-section of the hole pattern or the space pattern.

FIG. 11A shows an example of a hole pattern or a line pattern having an aspect ratio of "1". The aspect ratio is defined by a "dimension a in a depth direction/dimension b in a plane direction". In the hole pattern or the line pattern having the aspect ratio of "1", a relation between the dimension "a" in the depth direction and the dimension "b" in the plane direction becomes "a=b".

Figure 11B:
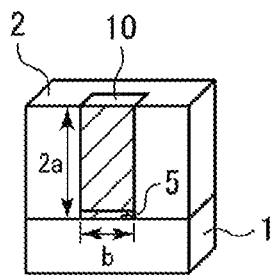

FIG. 11B shows an example of a hole pattern or a line pattern having an aspect ratio of "2". In the hole pattern or the line pattern having an aspect ratio of "2", a dimension in the depth direction is "2a", and a dimension in the plane direction is "b".

Figure 11C:
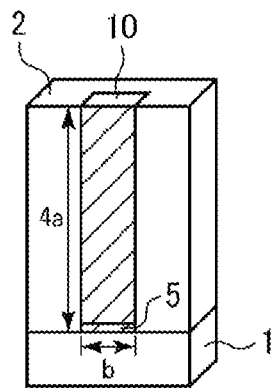

FIG. 11C shows an example of a hole pattern or a line pattern having an aspect ratio of "4". In the hole pattern or the line pattern having an aspect ratio of "4", a dimension in the depth direction is "4a", and a dimension in the plane direction is "b". An aspect ratio of the hole pattern shown in photographs shown in FIGS. 5 and 6 is substantially "4".

Figure 11D:
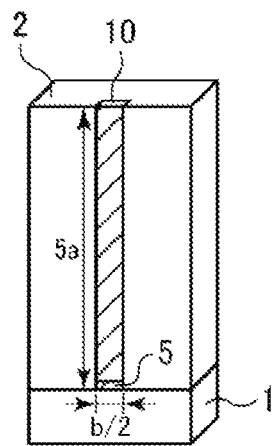

FIG. 11D shows an example of a hole pattern or a line pattern having an aspect ratio of "10". The hole pattern or the line pattern having the aspect ratio of "10" can be seen in a case where a dimension in the depth direction becomes deeper to "5a", while e.g., due to a miniaturization in the plane direction, a dimension in the plane direction is reduced to "b/2", or the like. Such patterns are used for, for example, a through-hole or the like of a semiconductor integrated circuit device having a multilayer wiring structure.

Although the selective epitaxial growth method according to the first and second embodiments can be applied to a burying process of a hole pattern or a line pattern having a high aspect ratio of more than "1", as exemplified in FIGS. 11A to 11D, it can also be applied to a burying process of a hole pattern or line pattern having an aspect ratio of less than "1".

Moreover, the selective epitaxial growth method according to the first and second embodiments is able to bury a hole pattern or a line pattern having a high aspect ratio without degrading the surface flatness or the crystalline orientation of the silicon epitaxial layer, and is able to selectively grow the silicon epitaxial layer within a hole pattern or a line pattern having a high aspect ratio, while inhibiting an increase in the processing time.

Therefore, the selective epitaxial growth method according to the first and second embodiments is particularly useful for a burying process of a hole pattern or a line pattern having a high aspect ratio. As a range of the aspect ratio of a hole pattern or a line pattern having a high aspect ratio, a range between "1 and 10" will give good results from a practical point of view. Among them, an aspect ratio ranging from "4 to 10" is particularly effective since the processing time begins to be considerably affected in that range.

Third Embodiment

Next, an example of a film forming apparatus capable of performing the selective epitaxial growth method according to the first and second embodiments of the present disclosure will be described as a third embodiment of the present disclosure.

<Film Forming Apparatus>

Figure 12:
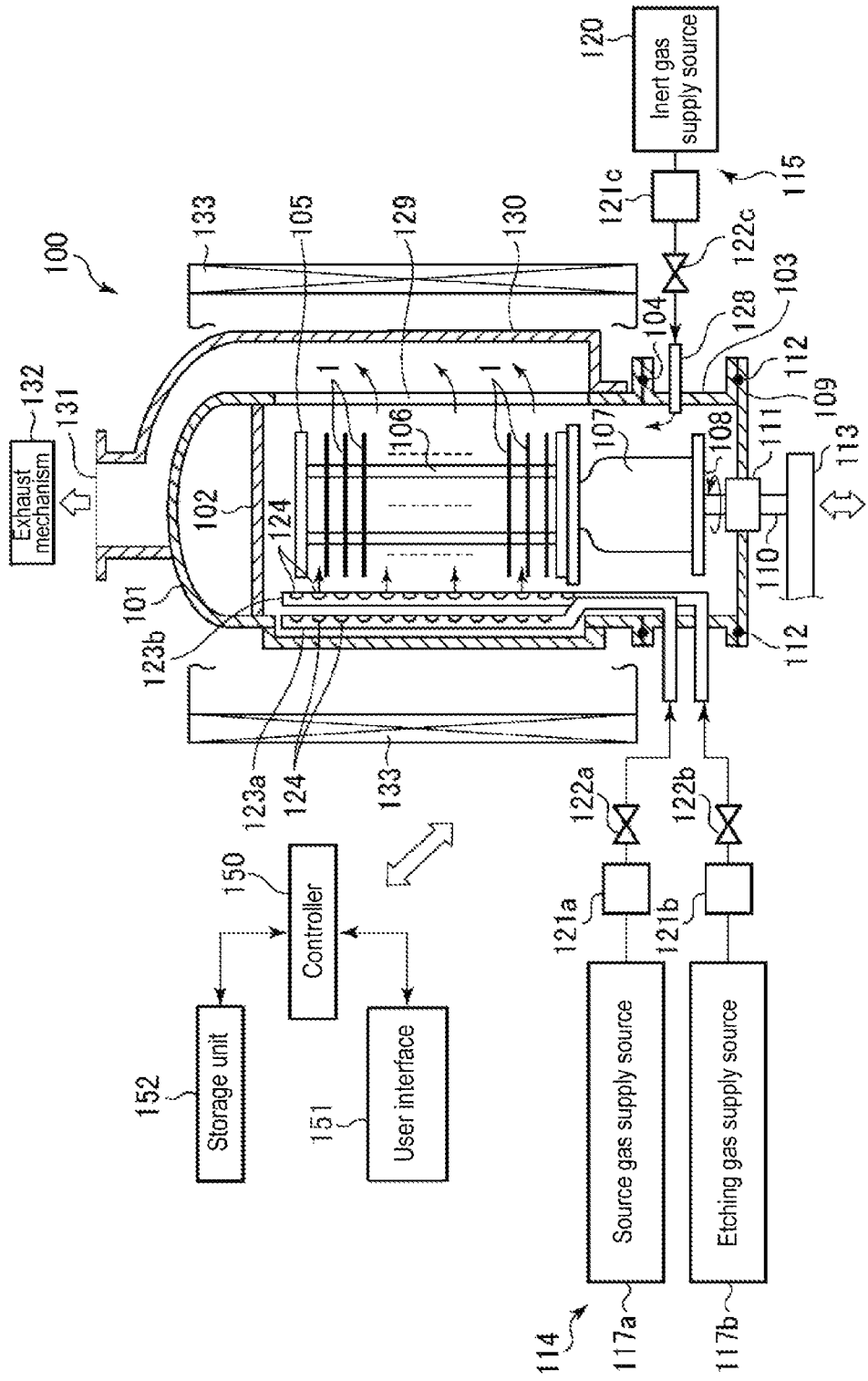
FIG. 12 schematically illustrates an example of a film forming apparatus according to a third embodiment of the present disclosure, in a cross-sectional view.

FIG. 12 schematically shows an example of the film forming apparatus according to a third embodiment of the present disclosure in a cross-sectional view.

As shown in FIG. 12, the film forming apparatus 100 has a cylindrical processing chamber 101 with an opened bottom and a ceiling. The entire processing chamber 101 is formed of, for example, quartz. A ceiling plate 102 made of quartz is installed in the ceiling of the processing chamber 101. A manifold 103 molded into a cylindrical shape, for example, by stainless steel is connected to a lower end opening of the processing chamber 101 via a sealing member 104 such as an O-ring.

The manifold 103 supports a lower end of the processing chamber 101. Through the lower side of the manifold 103, a wafer boat 105 can be introduced into the processing chamber 101. The wafer boat 105 is made of quartz and capable of placing a plurality of, for example, 50 to 100 sheets of the single crystal silicon substrates (silicon wafers) 1, as a target object to be processed, in multiple stages. Thus, the single crystal silicon substrate 1 is accommodated in the processing chamber 101. The wafer boat 105 has a plurality of support posts 106 and a plurality of the single crystal silicon substrates (silicon wafers) 1 is supported by grooves formed on the support posts 106.

The wafer boat 105 is placed on the table 108 via a heat insulating cylinder 107 made of quartz. The table 108 is supported on a rotary shaft 110 extending through a lid portion 109 which is, for example, made of stainless steel and configured to open and close a lower end opening of the manifold 103. In a portion through which the rotary shaft 110 extends, for example, a magnetic fluid seal 111 is installed to rotatably support the rotary shaft 110 while sealing the rotary shaft 110 in an airtight manner. A sealing member 112, for example, an O-ring is interposed between a peripheral portion of the lid portion 109 and a lower end portion of the manifold 103. In this manner, a seal is maintained in the processing chamber 101. For example, the rotary shaft 110 is attached to a front end of an arm 113 supported by a lifting mechanism such as a boat elevator (not shown). Thus, the wafer boat 105, the lid portion 109 or the like are integrally raised and lowered, and introduced into or removed from the interior of the processing chamber 101.

The film forming apparatus 100 includes a processing gas supply mechanism 114 which supplies processing gases used in the processing chamber 101, and an inert gas supply mechanism 115 which supplies an inert gas into the processing chamber 101.

The processing gas supply mechanism 114 of this embodiment includes a source gas supply source 117a serving as a source gas of the epitaxial layer, and an etching gas supply source 117b serving to etch the deposits. Further, the inert gas supply mechanism 115 includes an inert gas supply source 120.

As an example of the source gas, a monosilane gas is used when the selective epitaxial growth of silicon is performed. Further, in the case of the selective epitaxial growth of silicon, an example of the etching gas is a chlorine gas (hydrogen gas is used as a carrier gas) since the deposits are silicon. An example of the inert gas is nitrogen gas. The inert gas is used for a purge gas or the like.

The source gas supply source 117a is connected to a distribution nozzle 123a via a flow controller 121a and an on-off valve 122a. Similarly, the etching gas supply source 117b is connected to a distribution nozzle 123b via the flow controller 121b and an on-off valve 122b.

The distribution nozzles 123a, 123b are formed of a quartz tube, extending through the side wall of the manifold 103. Portions of the distribution nozzles 123a, 123b inside the manifold 103 are bent upward to vertically extend. In vertical portions of the distribution nozzles 123a and 123b, a plurality of gas discharge holes 124 is formed at predetermined intervals. Thus, each of the gases is substantially uniformly discharged toward the interior of the processing chamber 101 from the gas discharge holes 124 in a horizontal direction.

The inert gas supply source 120 is connected to the nozzle 128 via a flow controller 121c and an on-off valve 122c. The nozzle 128 extends through the side wall of the manifold 103 to discharge the inert gas toward the processing chamber 101 from its front end in the horizontal direction.

In a portion of the processing chamber 101 on a side opposite to the distribution nozzles 123a and 123b, an exhaust port 129 for exhausting the processing chamber 101 is formed. The exhaust port 129 is formed in an elongated shape by cutting off the side wall of the processing chamber 101 in the vertical direction. An exhaust port cover member 130 having a cross-section molded into a U-shape so as to cover the exhaust port 129 is attached by being welded to a portion of the processing chamber 101 corresponding to the exhaust port 129. The exhaust port cover member 130 extends upward along the side wall of the processing chamber 101 to form a gas outlet 131 above the processing chamber 101. An exhaust mechanism 132 including a vacuum pump or the like is connected to the gas outlet 131. The exhaust mechanism 132 exhausts an interior of the processing chamber 101 so that the processing gases used in the processing are exhausted while the pressure in the processing chamber 101 is kept to a processing pressure for the processing.

A cylindrical heating device 133 is installed on an outer periphery of the processing chamber 101. The heating device 133 activates the gas supplied into the processing chamber 101 and heats the target object for processing accommodated in the processing chamber 101, i.e., the single crystal silicon substrate 1 in this example.

The control of each unit of the film forming apparatus 100 is performed by a controller 150 including, for example, a microprocessor (computer). A user interface 151 including a touch panel, a display or the like is connected to the controller 150. The touch panel is used for an input operation of a command or the like by the operator to manage the film forming apparatus 100. The display is used to visualize and display the operation status of the film forming apparatus 100.

A storage unit 152 is connected to the controller 150. The storage unit 152 stores a control program for realizing various processes that are performed by the film forming apparatus 100 by the control of the controller 150, or a program for causing each component of the film forming apparatus 100 to perform the process according to the processing conditions, i.e., a recipe. For example, the recipe is stored in a storage medium of the storage unit 152. The storage medium may be a hard disk and a semiconductor memory, or may be a portable medium such as a CD-ROM, a DVD, and a flash memory. Further, the recipe may be appropriately transmitted from another device, for example, via a dedicated line. If necessary, the recipe may be read from the storage unit 152 by instructions from the user interface 151, and desired processes are performed in the film forming apparatus 100 under the control of the controller 150 executing the process based on the read recipe.

In this example, the film forming processes according to the selective epitaxial growth methods according to the first and second embodiments are sequentially performed under the control of the controller 150.

The selective epitaxial growth methods according to the first and second embodiments may be performed in one film forming apparatus by using the film forming apparatus 100 as shown in FIG. 12.

Further, the etching gas supply source 117b of the film forming apparatus 100 supplies an etching gas capable of etching the silicon. In a case where the single crystal substrate is a single crystal silicon substrate 1 and the selective epitaxial growth of the silicon is performed, it is also possible to use the film forming apparatus 100 in performing Step S3 (recess process) shown in FIG. 1.

Further, the type of film forming apparatus is not limited to a batch type as shown in FIG. 12 and may be a single-wafer type film forming apparatus.

Although the present disclosure has been described herein with respect of the embodiments, it is not limited to the above-described embodiments and can be variously modified.

For example, in the above-described embodiment, the processing conditions have been specifically exemplified, but the processing conditions are not limited to the above-described specific examples. The processing conditions can be appropriately changed depending upon the situation.

For example, in the above-described embodiments, the processing temperature when growing the silicon epitaxial layer was set to 550 degrees C., but the processing temperature is not limited to 550 degrees C. As a processing temperature when growing the silicon epitaxial layer, it is possible to select a range between 500 degrees C. and 700 degrees C. A basis for the lower limit temperature of 500 degrees C. is found in that if the processing temperature becomes less than 500 degrees C., the epitaxial growth of silicon can not be initiated. Further, a basis for the upper limit temperature of 700 degrees C. is found in that if the processing temperature exceeds 700 degrees C., silicon shows a tendency of a vapor deposition reaction rather than the epitaxial growth so that the uniformity of the grown silicon epitaxial layer begins to degrade.

Further, the source gas and the etching gas are not limited to those exemplified in the above-described embodiments. When a target material of the selective epitaxial growth is silicon, any kind of gas may be used as a source gas as long as they can grow silicon. Similarly, when silicon is a target material of the selective epitaxial growth, any kind of gas may be used as an etching gas as long as they can etch silicon.

In addition, the selective epitaxial growth method described in the above-described embodiments enables the growth of the selective epitaxial layer in the hole pattern or a space pattern having a high aspect ratio, without degradation of the crystalline orientation, while preventing an increase in processing time. Therefore, the above-described embodiments can be appropriately used for a method of manufacturing electronic products whose miniaturization has been required, for example, a manufacturing process of the semiconductor integrated circuit device, and a manufacturing process of a flat panel display.

In addition, the present disclosure can be variously modified without departing from the gist thereof.

According to the present disclosure, it is possible to a provide a selective epitaxial growth method capable of preventing an increase in the processing time without degrading the surface flatness of the epitaxial layer or crystalline orientation of the epitaxial layer, and a film forming apparatus capable of performing the selective epitaxial growth method.

While certain embodiments have been described, these embodiments have been presented by way of example only, and are not intended to limit the scope of the disclosures. Indeed, the embodiments described herein may be embodied in a variety of other forms. Further, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A selective epitaxial growth method of selectively growing an epitaxial layer, the method comprising:

preparing a target object to be processed including a single crystal substrate in which an epitaxial growth region is partitioned by a growth suppression film;

forming a recess in the epitaxial growth region such that crystal defects existing in the epitaxial growth region are removed; and selectively growing the epitaxial layer on the epitaxial growth region of the target object until a predetermined film thickness is obtained, wherein selectively growing the epitaxial layer includes performing:

first source gas supply process of supplying a source gas containing the same element as an element of the single crystal substrate onto the target object under a first processing pressure to grow a first epitaxial layer on the epitaxial growth region;

after the first source gas supply process supplying a source gas, first removing process of removing deposits accumulated on the growth suppression film due to the supply of the source gas in the first source gas supply process;

after the first removing process of removing deposits, second source gas supply process of supplying the source gas onto the target object under a second processing pressure higher than the first processing pressure to grow a second epitaxial layer on the first epitaxial layer grown on the epitaxial growth region; and after the second source gas supply process of supplying the source gas, second removing process of removing the deposits accumulated on the growth suppression film due to the supply of the source gas in the second source gas supply process, wherein the second source gas supply process and the second removing process are repeated until the predetermined film thickness is obtained, and wherein a relation between a ratio $T_G A/T_E B$ of a growth time $T_G A$ of the second epitaxial layer in the second source gas supply process to a removal time $T_E B$ of the deposits in the second removing process and a ratio $T_G C/T_E D$ of a growth time $T_G C$ of the first epitaxial layer in the first source gas supply process to a removal time $T_E D$ of the deposits in the first removing process is set to $T_G A/T_E B > T_G C/T_E D$.

2. The selective epitaxial growth method of claim 1, wherein a thickness of the first epitaxial layer remaining after the first removing process is set to a thickness so that crystal defects in the first epitaxial layer disappear from a surface of the first epitaxial layer obtained after the first removing process, the crystal defects being grown from crystal defects existing in the epitaxial growth region.

3. The selective epitaxial growth method of claim 1, wherein the first source gas supply process and the first removing process are repeated until the thickness of the first epitaxial layer remaining after the first removing process becomes thick enough so that the crystal defects in the first epitaxial layer disappear from a surface of the first epitaxial layer obtained after the first removing process, the crystal defects being grown from crystal defects existing in the epitaxial growth region.

4. The selective epitaxial growth method of claim 1, wherein a growth time of the second epitaxial layer in the second source gas supply process is set to be shorter than a growth time of the first epitaxial layer in the first source gas supply process.

5. The selective epitaxial growth method of claim 1, wherein a removal time of the deposits in the first removing process and a removal time of the deposits in the second removing process are set to a time during which the deposits deposited on the growth suppression film are removed, respectively, and wherein the first epitaxial layer grown in the first source gas supply gas and the second epitaxial layer grown in the second source gas supply gas remain after the first removing process and the second removing process, respectively.

6. The selective epitaxial growth method of claim 5, wherein growth conditions of the first epitaxial layer in the first source gas supply process and removal conditions of the deposits in the first removing process are set such that a growth rate of the first epitaxial layer after the first removing process is within a range of a saturation growth rate, and wherein growth conditions of the second epitaxial layer in the second source gas supply process and removal conditions of the deposits in the second removing process are set such that a growth rate of the second epitaxial layer after the second removing process is within the range of the saturation growth rate.

7. The selective epitaxial growth method of claim 6, wherein the range of the saturation growth rate includes a peak growth rate at which the growth rates of the first epitaxial layer and the second epitaxial layer becomes maximum, and wherein the growth conditions of the first epitaxial layer in the first source gas supply process and the removal conditions of the deposits in the first removing process, and the growth conditions of the second epitaxial layer in the second source gas supply process and the removal conditions of the deposits in the second removing process are selected such that the growth times of the first epitaxial layer and the second epitaxial layer, and the removal time of the deposits become shorter, based on the peak growth rate.

8. The selective epitaxial growth method of claim 1, wherein growth conditions of the second epitaxial layer are set such that a growth rate of the second epitaxial layer in the second source gas supply process becomes higher than a growth rate of the first epitaxial layer in the first source gas supply process.

9. The selective epitaxial growth method of claim 1, wherein the growth suppression film partitions the epitaxial growth region on the single crystal substrate into a hole pattern or a line-and-space pattern, and wherein an aspect ratio of the hole pattern or an aspect ratio of the space pattern of the line-and-space pattern along a minor axis direction is set to a range between 1 and 10.

10. The selective epitaxial growth method of claim 9, wherein the aspect ratio is set to a range between 4 and 10.

11. The selective epitaxial growth method of claim 1, wherein the single crystal substrate is of silicon and the epitaxial layer is of silicon.

\* \* \* \* \*